(12) United States Patent
Chi et al.

(10) Patent No.: US 9,158,324 B2
(45) Date of Patent: *Oct. 13, 2015

(54) SUBSTRATE BIAS CONTROL CIRCUIT

(71) Applicant: TAIWAN SEMICONDUCTOR MANUFACTURING COMPANY, LTD., Hsinchu (TW)

(72) Inventors: Shyh-An Chi, Hsinchu (TW); Shiue Tsong Shen, Tuku Township (TW); Jyy Anne Lee, Taipei (TW); Yun-Han Lee, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/025,171

(22) Filed: Sep. 12, 2013

(65) Prior Publication Data
US 2014/0015599 A1 Jan. 16, 2014

Related U.S. Application Data

(63) Continuation of application No. 12/793,884, filed on Jun. 4, 2010, now Pat. No. 8,552,795.

(60) Provisional application No. 61/254,055, filed on Oct. 22, 2009.

(51) Int. Cl.
| | |
|---|---|
| G05F 3/08 | (2006.01) |
| H03K 17/14 | (2006.01) |
| G05F 3/20 | (2006.01) |
| H03K 19/003 | (2006.01) |

(52) U.S. Cl.
CPC .......... G05F 3/205 (2013.01); H03K 19/00384 (2013.01)

(58) Field of Classification Search
CPC .................. H03K 19/00369; H03K 19/00384; H03K 2217/0018; G05F 3/205
USPC ................. 327/512, 513, 534, 537, 541, 543; 323/907
See application file for complete search history.

(56) References Cited

U.S. PATENT DOCUMENTS

| | | | |
|---|---|---|---|
| 5,397,934 A * | 3/1995 | Merrill et al. ................. | 327/537 |
| 5,638,418 A | 6/1997 | Douglass et al. | |
| 6,695,475 B2 | 2/2004 | Yin | |
| 6,831,500 B2 | 12/2004 | Sato et al. | |

(Continued)

OTHER PUBLICATIONS

Tschanz, James W., et al., "Adaptive Body Bias Reducing Impacts of Die-to-Die and Within-Die Parameter Variations on Microprocessor Frequency and Leakage", IEEE Journal of Solid-State Circuits, vol. 37, No. 11, Nov. 2002.

*Primary Examiner* — Patrick O'Neill
(74) *Attorney, Agent, or Firm* — Hauptman Ham, LLP

(57) ABSTRACT

An integrated circuit includes a process voltage temperature (PVT) effect transducer responsive to a PVT effect, a PVT effect quantifier coupled to the PVT effect transducer and configured to quantify the PVT effect to provide an output, and a bias controller configured to receive the output of the PVT effect quantifier and provide a bias voltage for a substrate of an NMOS or a PMOS transistor. The bias controller is configured to compare the output received from the PVT effect quantifier to a threshold value, and decrease or increase the bias voltage depending on whether the output is higher or lower than the threshold value.

20 Claims, 5 Drawing Sheets

(56) References Cited

U.S. PATENT DOCUMENTS

| | | |
|---|---|---|
| 7,250,807 B1 | 7/2007 | Doyle |
| 7,463,096 B2 | 12/2008 | Chi et al. |
| 7,696,811 B2 | 4/2010 | Barrows et al. |
| 7,994,842 B2 * | 8/2011 | Ito .................................. 327/534 |
| 8,552,795 B2 * | 10/2013 | Chi et al. ....................... 327/543 |
| 2005/0052219 A1 * | 3/2005 | Butler et al. .................. 327/534 |

* cited by examiner

| | TYP corner Ring OSC count | Voltage A ($V_{PP}/V_{BB}$) |
|---|---|---|
| Entry A | | |
| Entry B | FF corner Ring OSC count | Voltage B ($V_{PP}/V_{BB}$) |

Fig. 4

SUBSTRATE BIAS CONTROL CIRCUIT

PRIORITY CLAIM

The present application is a continuation of U.S. application Ser. No. 12/793,884, filed on Jun. 4, 2010, issued as U.S. Pat. No. 8,552,795 on Oct. 8, 2013, which claims priority of U.S. Provisional Patent Application Ser. No. 61/254,055, filed on Oct. 22, 2009. The entire contents of the above-listed applications are incorporated herein by reference.

TECHNICAL FIELD

The present disclosure relates generally to an integrated circuit, more particularly a substrate bias control circuit.

BACKGROUND

A conventional substrate bias control circuit uses a phase detector circuit to measure process voltage temperature (PVT) effect. However, because this circuit is generally a combination of digital and analog circuits, it is not easy to be integrated in a system on chip (SOC) design. Also, it is not easy to migrate to other technology node as the integrated circuit scale shrinks. Accordingly, new substrate bias control circuits are desired.

BRIEF DESCRIPTION OF THE DRAWINGS

For a more complete understanding of the present disclosure, and the advantages of disclosed embodiments, reference is now made to the following descriptions taken in conjunction with the accompanying drawings, in which:

FIG. 4 illustrates an exemplary bias voltage lookup table associated with the exemplary embodiment of the substrate bias control circuit in FIG. 3;

DETAILED DESCRIPTION

The making and using of exemplary embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

An exemplary circuit that is described in the disclosure is configured to provide an appropriate substrate bias (based on PVT variation) to adjust chip performance and power consumption. The circuit can be easily integrated in an SOC design. If the substrate of a metal-oxide-semiconductor field-effect transistor (MOSFET) device is backward biased, power consumption of the devices can be saved. If the substrate of a MOSFET device is forward biased, speed of the devices can be boosted.

Figure 1:
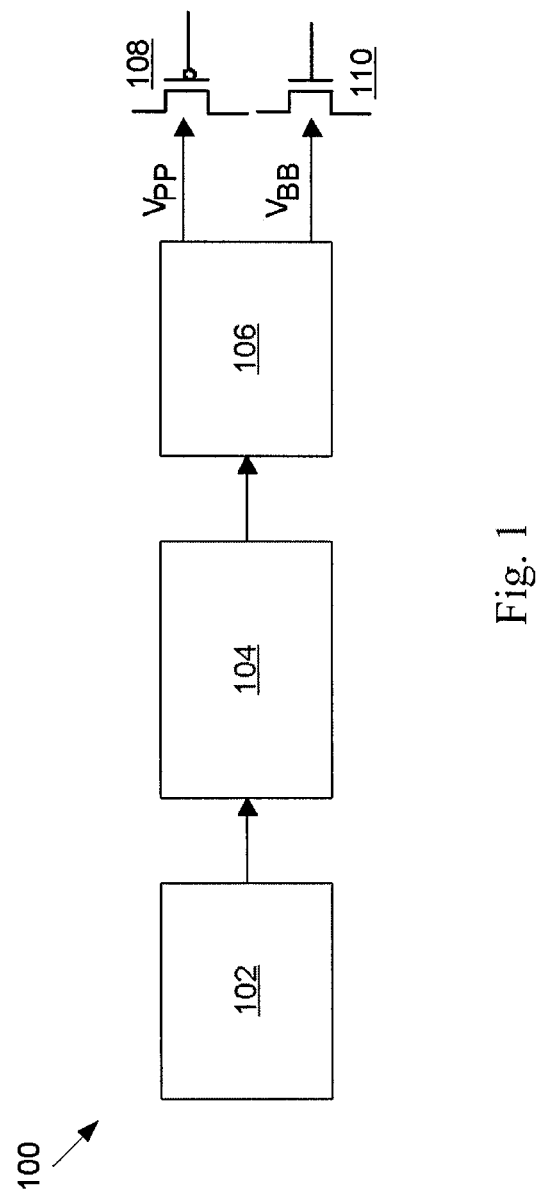
FIG. 1 illustrates a schematic drawing of an exemplary substrate bias control circuit.

FIG. 1 illustrates a schematic drawing of an exemplary substrate bias control circuit. The substrate bias control circuit 100 includes a PVT effect transducer 102, a PVT effect quantifier 104, and a bias controller 106. The PVT effect transducer 102 responds to the PVT environment change and shows a corresponding physical characteristic change that can be measured, e.g. a frequency change of a ring oscillator. The PVT effect transducer 102 is coupled to the PVT effect quantifier 104.

The PVT effect quantifier 104 quantifies the physical characteristic change that is detected from the PVT effect transducer 102. For example, pulses from a ring oscillator can be counted during a specified time to show its frequency change due to PVT variations. The PVT effect quantifier 104 is coupled to the bias controller 106.

The bias controller 106 receives the quantified output from the PVT effect quantifier 104 and controls the substrate bias voltages $V_{PP}$ and $V_{BB}$ for a p-channel MOSFET (PMOS) transistor 108 and an n-channel MOSFET (NMOS) transistor 110, respectively. The bias controller 106 can have a programmable or configurable input for threshold values or lookup table for its decision-making.

Figure 2:
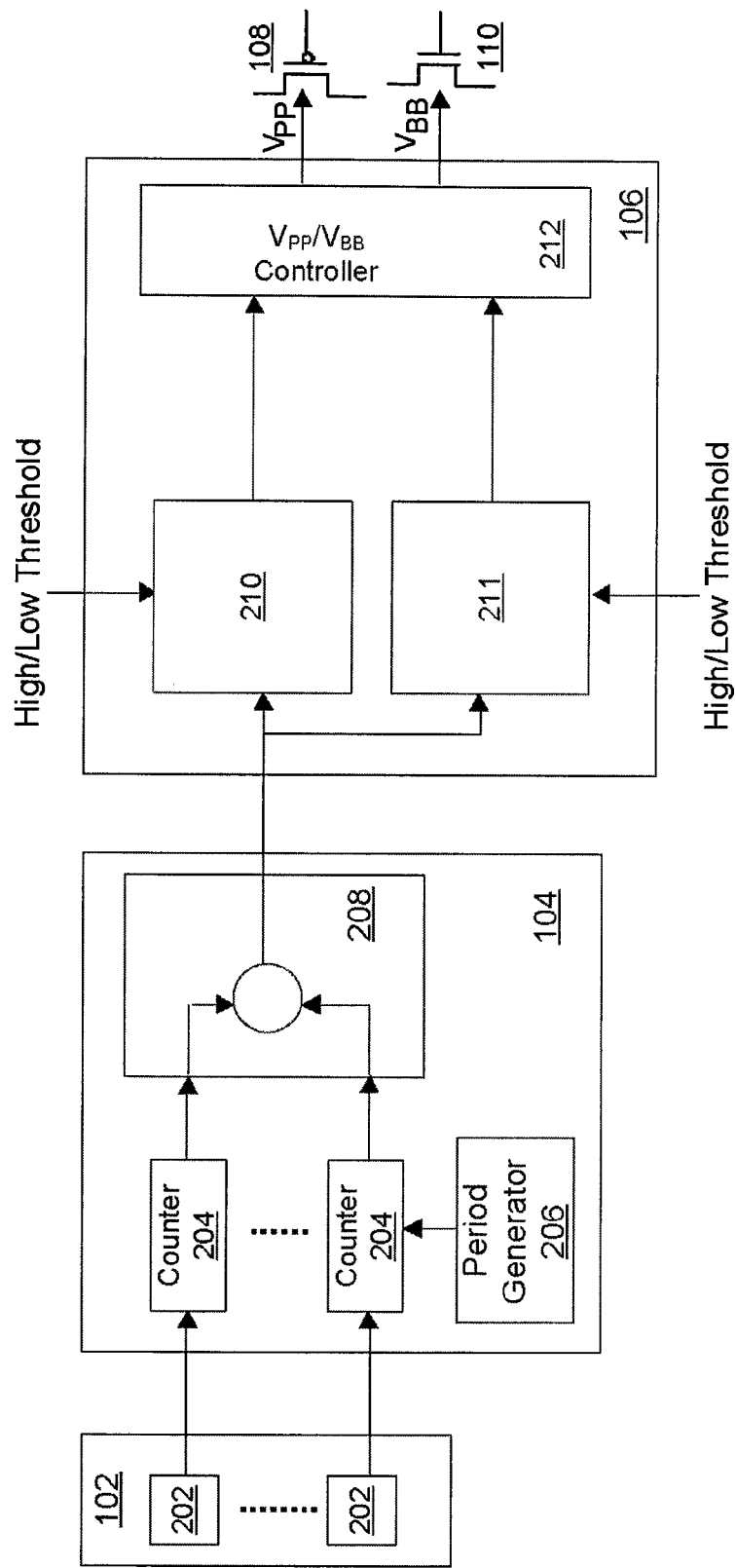
FIG. 2 illustrates an exemplary embodiment of the substrate bias control circuit.

FIG. 2 illustrates an exemplary embodiment of the substrate bias control circuit. In FIG. 2, the PVT effect transducer 102 includes ring oscillators 202. The ring oscillators 202 generate pulses at certain frequencies and include an odd number of inverters. Each inverter contributes to the delay of the signal passing the ring of inverters. Changing the power supply voltage changes the delay through each inverter, and thus changes the oscillator frequency. For example, higher voltages typically decreasing the delay and increasing the oscillator frequency. The frequencies of the ring oscillators 202 reflect the PVT environment variations.

In some embodiments, the PVT effect quantifier 104 includes at least one counter, e.g. counters 204, and a period generator 206. The period generator 206 provides a time period for the counters 204. The counters 204 are connected to ring oscillators 202. The counters 204 provide counter values of each ring oscillator 202 during the time period generated by the period generator 206.

The PVT effect quantifier 104 can further include a counter comparator 208, and the counter comparator 208 compares counter values from each counter 204 and selects one counter value as the output of the PVT effect quantifier 104. The selection of one counter value can be according to any desired criteria, e.g. a median (typical) value, the highest (fastest) value, the lowest (slowest) value, etc.

In some embodiments, the counter comparator 208 is optional. For example, if only one ring oscillator 202 and one counter 204 are used, then the counter comparator 208 can be saved and the counter value is sent to the bias controller 106 as the output of the PVT effect quantifier 104.

The bias controller 106 includes bias voltage comparators 210 and 211. The bias controller 106 can use the output of the PVT effect quantifier 104 to determine the bias voltages $V_{PP}$ and $V_{BB}$. When the count value is higher than a high threshold value, then a backward bias for the substrate of a MOSFET device can be used to save power. When the count value is lower than the low threshold value, a forward bias can be used to boost performance. Device characterization data can be used to determine the high/low threshold values. For example, the device characterization data can relate to the count value and corresponding high/low threshold values. The bias voltage comparators 210 and 211 can be merged into one bias voltage comparator.

More particularly, the bias voltage comparator 210 compares the output received from the PVT effect quantifier 104 to a high threshold value. If the output is higher than the high threshold value, the $V_{PP}/V_{BB}$ controller 212 in the bias controller 106 increases the bias voltage $V_{PP}$ for PMOS transistor 108. The bias voltage $V_{PP}$ is connected to the substrate of the PMOS transistor 108. The increase or decrease step value can be programmed. For example, a 50 mV step can be used in one embodiment.

The bias voltage comparator 210 compares the output received from the PVT effect quantifier 104 to a low threshold value. If the output is lower than the low threshold value, the $V_{PP}/V_{BB}$ controller 212 in the bias controller 106 decreases the bias voltage $V_{PP}$ for PMOS transistor 108.

The bias voltage comparator 211 compares the output received from the PVT effect quantifier 104 to a high threshold value. If the output is higher than the high threshold value, the $V_{PP}/V_{BB}$ controller 212 in the bias controller 106 decreases the bias voltage $V_{BB}$ for NMOS transistor 110. The bias voltage $V_{BB}$ is connected to the substrate of an NMOS transistor 110.

The bias voltage comparator 211 compares the output received from the PVT effect quantifier 104 to a low threshold value. If the output is lower than the low threshold value, the $V_{PP}/V_{BB}$ controller 212 in the bias controller 106 increases the bias voltage $V_{BB}$ for NMOS transistor 110.

The embodiment in FIG. 2 can be referred to as a closed-loop adaptive substrate bias control circuit in the sense that the bias voltages are continuously adjusted and updated based on the comparison with programmable or configurable threshold values.

Figure 3:
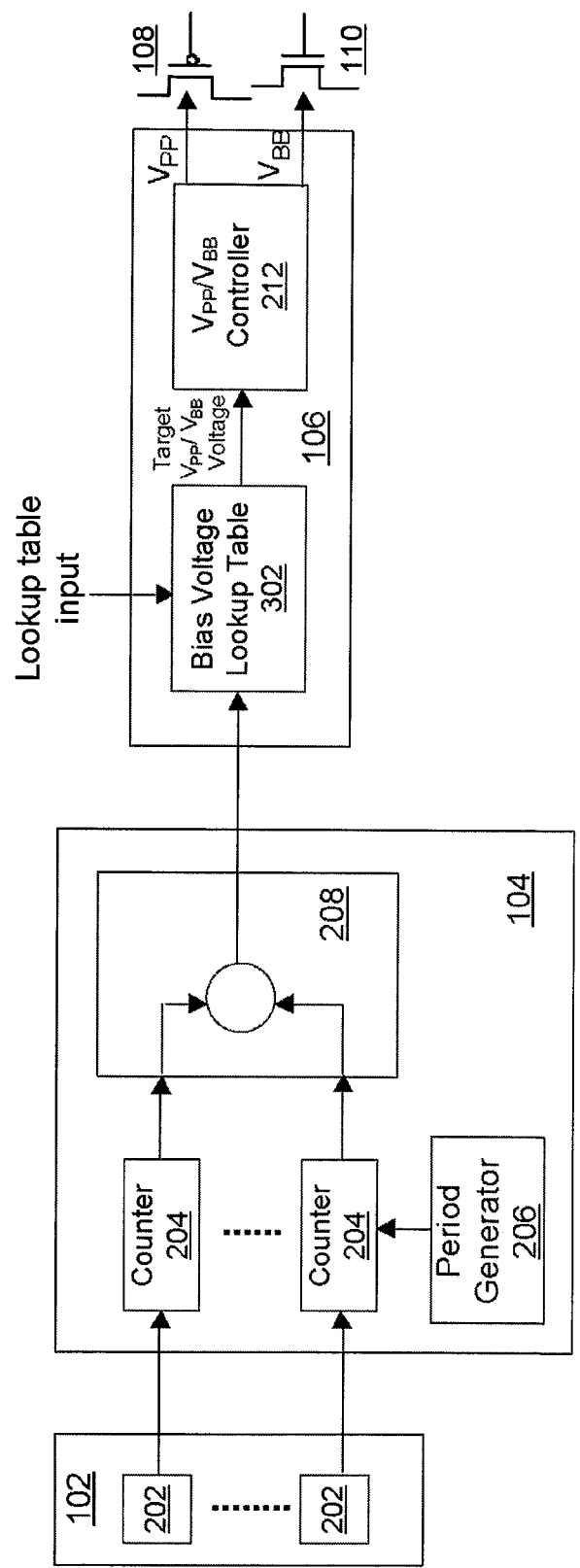
FIG. 3 illustrates another exemplary embodiment of the substrate bias control circuit.

FIG. 3 illustrates another exemplary embodiment of the substrate bias control circuit. The PVT effect transducer 102 and the PVT effect quantifier 104 have similar components as the embodiment shown in FIG. 2. However, the bias controller 106 has a programmable or configurable bias voltage lookup table 302 instead of the bias voltage comparators 210 and 211. The bias voltage lookup table 302 can be updated through an outside input.

In one embodiment, the bias voltage lookup table 302 can include reference values for the output of the PVT effect quantifier 104 and $V_{PP}/V_{BB}$ target values that correspond to the reference values. In the bias controller 106, the output from the PVT effect quantifier 104 can be compared to the reference values in the bias voltage lookup table 302, and corresponding $V_{PP}/V_{BB}$ target values can be used to control the substrate bias voltages for PMOS transistor 108 and NMOS transistor 110.

The embodiment in FIG. 3 can be referred to as an open-loop adaptive substrate bias control circuit in the sense that the bias voltages can be adjusted at once to the target values, based on the reference values in the bias voltage lookup table 302.

FIG. 4 illustrates an exemplary bias voltage lookup table associated with the exemplary embodiment of the substrate bias control circuit in FIG. 3. Entry A in the first row includes a typical corner ring oscillator count value as the reference value and Voltage A as the $V_{PP}/V_{BB}$ target value. Field of Voltage A contains two target values for $V_{PP}$ and $V_{BB}$, respectively. The typical corner refers to a portion of integrated circuits on a semiconductor wafer that shows typical NMOS/PMOS transistor performances. Entry B in the second row includes a fast-fast (FF) corner ring oscillator count value as the reference value and Voltage B as the $V_{PP}/V_{BB}$ target value. Field of Voltage B contains two target values for $V_{PP}$ and $V_{BB}$, respectively. The FF corner refers to a portion of integrated circuits on a semiconductor wafer that shows relatively fast NMOS/PMOS transistor performances.

If the count value from PVT effect quantifier 104 is higher than the entry A's ring oscillator count value, but lower than entry B's ring oscillator count value, then the bias controller 106 can use Voltage A as the target voltage. If the count value from PVT effect quantifier 104 is higher than entry B's ring oscillator count value, the bias controller 106 can use Voltage B as the target voltage. In this simple example, the count value is assumed to be higher than the entry A's ring oscillator count value. Even though one embodiment of the bias voltage lookup table is described above for illustration, the bias voltage lookup table may include different formats and different values, and the bias controller 106 can use different algorithms in embodiments.

Figure 5B:
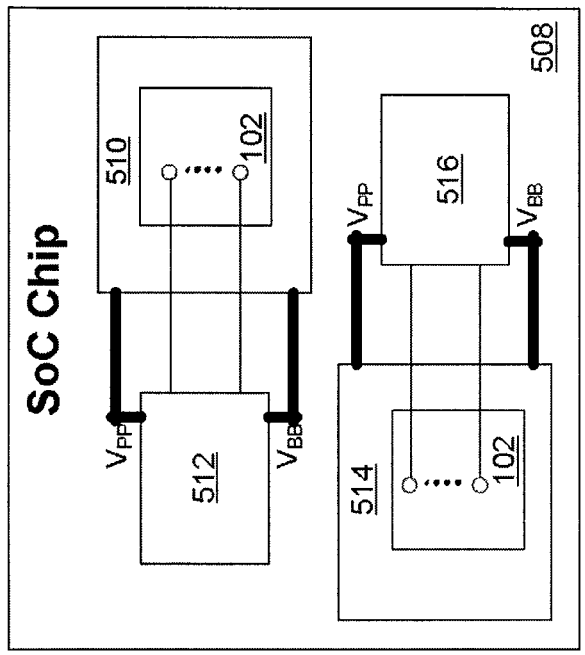
FIG. 5B illustrates a schematic drawing of another exemplary implementation of the substrate bias control circuit on a SOC chip.
Figure 5A:
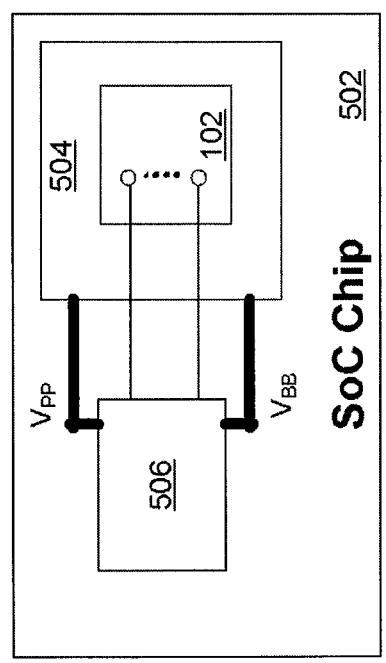
FIG. 5A illustrates a schematic drawing of an exemplary implementation of the substrate bias control circuit on a SOC chip.

FIG. 5A illustrates a schematic drawing of an exemplary implementation of the substrate bias control circuit on a SOC chip. The SOC chip 502 includes a power domain 504 and closed/open-loop bias control circuit 506. The power domain 504 includes the PVT effect transducer 102 and other integrated circuits, e.g. memories, logics, NMOS transistors, PMOS transistors, etc. The PVT effect transducer 102 is located on the SOC chip 502 where the PVT effects need to be monitored, because PVT effects can affect the integrated circuit performance. The closed/open-loop bias control circuit 506 includes the PVT effect quantifier 104 and the bias controller 106 in FIG. 1. The bias controller 106 can be either a closed-loop adaptive substrate bias control circuit as shown in FIG. 2, or an open-loop adaptive substrate bias control circuit as shown in FIG. 3. The functions of the PVT effect transducer 102, PVT effect quantifier 104, and bias controller 106 are the same as described above.

FIG. 5B illustrates a schematic drawing of another exemplary implementation of the substrate bias control circuit on a SOC chip. The SOC chip 508 includes two separate power domains 510 and 514 and two separate closed/open-loop bias control circuits 512 and 516. Each closed/open-loop bias control circuit 512 or 516 includes the PVT effect quantifier 104 and the bias controller 106. Each of the two power domains 510 or 514 includes a separate PVT effect transducer 102, because different location on the SOC chip 508 can be subject to different PVT effects. Based on the local PVT effects monitored by the PVT effect transducer 102, separate closed/open-loop bias control circuits 512 and 516 can adjust the bias voltages separately. The functions of the PVT effect transducer 102, PVT effect quantifier 104, and bias controller 106 are the same as described above.

The substrate bias voltage control circuit described above can be implemented solely by logic circuit process, and thus it can be easily integrated in an SOC design. Also programmable or configurable input for threshold values and bias voltage lookup tables allows easy fine-tuning. The methodology described in the present disclosure can be migrated to any technology node easily. A person skilled in the art will appreciate that there can be many embodiment variations for disclosed embodiments.

In some embodiments, an integrated circuit includes a process voltage temperature (PVT) effect transducer responsive to a PVT effect, a PVT effect quantifier coupled to the PVT effect transducer and configured to quantify the PVT effect to provide an output, and a bias controller configured to receive the output of the PVT effect quantifier and provide a bias voltage for a substrate of a p-channel metal-oxide semiconductor (PMOS) transistor. The bias controller is further configured to compare the output received from the PVT effect quantifier to a first threshold value, and increase the bias voltage if the output is higher than the first threshold value.

In some embodiments, an integrated circuit includes a process voltage temperature (PVT) effect transducer responsive to a PVT effect, a PVT effect quantifier coupled to the PVT effect transducer and configured to quantify the PVT effect to provide an output, and a bias controller configured to receive the output of the PVT effect quantifier and provide a bias voltage for a substrate of a p-channel metal-oxide semiconductor (PMOS) transistor. The bias controller is further configured to compare the output received from the PVT effect quantifier to a first threshold value, and decrease the bias voltage if the output is lower than the first threshold value.

In some embodiments, an integrated circuit includes a process voltage temperature (PVT) effect transducer responsive to a PVT effect, a PVT effect quantifier coupled to the PVT effect transducer and configured to quantify the PVT effect to provide an output, and a bias controller configured to receive the output of the PVT effect quantifier and provide a bias voltage for a substrate of an n-channel metal-oxide semiconductor (NMOS) transistor. The bias controller is further configured to compare the output received from the PVT effect quantifier to a first threshold value, and decrease the bias voltage if the output is higher than the first threshold value.

In some embodiments, an integrated circuit includes a process voltage temperature (PVT) effect transducer responsive to a PVT effect, a PVT effect quantifier coupled to the PVT effect transducer and configured to quantify the PVT effect to provide an output, and a bias controller configured to receive the output of the PVT effect quantifier and provide a bias voltage for a substrate of an n-channel metal-oxide semiconductor (NMOS) transistor. The bias controller is further configured to compare the output received from the PVT effect quantifier to a first threshold value, and increase the bias voltage if the output is lower than the first threshold value.

Although exemplary embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit, comprising:
a process voltage temperature (PVT) effect transducer responsive to a PVT effect;
a PVT effect quantifier coupled to the PVT effect transducer and configured to quantify the PVT effect to provide an output; and
a bias controller configured to receive the output of the PVT effect quantifier and provide a bias voltage for a substrate of a p-channel metal-oxide semiconductor (PMOS) transistor;
wherein the bias controller is further configured to compare the output received from the PVT effect quantifier to a first threshold value, and increase the bias voltage if the output is higher than the first threshold value.

2. The integrated circuit of claim 1, wherein
the PVT effect quantifier comprises a first counter configured to provide a first counter value during a time period, and
the PVT effect transducer comprises a first ring oscillator connected to the first counter and configured to generate pulses to be counted by the first counter as the first counter value during the time period.

3. The integrated circuit of claim 2, wherein
the PVT effect quantifier further comprises a second counter configured to provide a second counter value during the time period, and
the PVT effect transducer further comprises a second ring oscillator connected to the second counter and configured to generate pulses to be counted by the second counter as the second counter value during the time period.

4. The integrated circuit of claim 3, wherein
the PVT effect quantifier further comprises a counter comparator configured to compare the first counter value with the second counter value, and select the first counter value or the second counter value as the output of the PVT effect quantifier.

5. The integrated circuit of claim 1, wherein
the bias controller is further configured to compare the digital output received from the PVT effect quantifier to a second threshold value that is lower than the first threshold value, and decrease the bias voltage if the output is lower than the second threshold value.

6. An integrated circuit, comprising:
a process voltage temperature (PVT) effect transducer responsive to a PVT effect;
a PVT effect quantifier coupled to the PVT effect transducer and configured to quantify the PVT effect to provide an output; and
a bias controller configured to receive the digital output of the PVT effect quantifier and provide a bias voltage for a substrate of a p-channel metal-oxide semiconductor (PMOS) transistor;
wherein the bias controller is further configured to compare the digital output received from the PVT effect quantifier to a first threshold value, and decrease the bias voltage if the digital output is lower than the first threshold value.

7. The integrated circuit of claim 6, wherein
the PVT effect quantifier comprises a first counter configured to provide a first counter value during a time period, and
the PVT effect transducer comprises a first ring oscillator connected to the first counter and configured to generate pulses to be counted by the first counter as the first counter value during the time period.

8. The integrated circuit of claim 7, wherein
the PVT effect quantifier further comprises a second counter configured to provide a second counter value during the time period, and
the PVT effect transducer further comprises a second ring oscillator connected to the second counter and configured to generate pulses to be counted by the second counter as the second counter value during the time period.

9. The integrated circuit of claim 8, wherein
the PVT effect quantifier further comprises a counter comparator configured to compare the first counter value with the second counter value, and select the first counter value or the second counter value as the output of the PVT effect quantifier.

10. The integrated circuit of claim 6, wherein
the bias controller is further configured to provide a further bias voltage for a substrate of an n-channel metal-oxide semiconductor (NMOS) transistor, and increase the further bias voltage if the digital output is lower than the first threshold value.

11. An integrated circuit, comprising:
a process voltage temperature (PVT) effect transducer responsive to a PVT effect;
a PVT effect quantifier coupled to the PVT effect transducer and configured to quantify the PVT effect to provide an output; and
a bias controller configured to receive the digital output of the PVT effect quantifier and provide a bias voltage for a substrate of an n-channel metal-oxide semiconductor (NMOS) transistor,
wherein the bias controller is configured to compare the digital output received from the PVT effect quantifier to a first threshold value, and decrease the bias voltage if the digital output is higher than the first threshold value.

12. The integrated circuit of claim 11, wherein
the PVT effect quantifier comprises a first counter configured to provide a first counter value during a time period, and
the PVT effect transducer comprises a first ring oscillator connected to the first counter and configured to generate pulses to be counted by the first counter as the first counter value during the time period.

13. The integrated circuit of claim 12, wherein
the PVT effect quantifier further comprises a second counter configured to provide a second counter value during the time period, and
the PVT effect transducer further comprises a second ring oscillator connected to the second counter and configured to generate pulses to be counted by the second counter as the second counter value during the time period.

14. The integrated circuit of claim 13, wherein
the PVT effect quantifier further comprises a counter comparator configured to compare the first counter value with the second counter value, and select the first counter value or the second counter value as the output of the PVT effect quantifier.

15. The integrated circuit of claim 11, wherein
the bias controller is further configured to provide a further bias voltage for a substrate of a p-channel metal-oxide semiconductor (PMOS) transistor, and increase the further bias voltage if the digital output is higher than the first threshold value.

16. An integrated circuit, comprising:
a process voltage temperature (PVT) effect transducer responsive to a PVT effect;
a PVT effect quantifier coupled to the PVT effect transducer and configured to quantify the PVT effect to provide a digital output; and
a bias controller configured to receive the digital output of the PVT effect quantifier and provide a bias voltage for a substrate of an n-channel metal-oxide semiconductor (NMOS) transistor,
wherein the bias controller is configured to compare the digital output received from the PVT effect quantifier to a first threshold value, and increase the bias voltage if the digital output is lower than the first threshold value.

17. The integrated circuit of claim 16, wherein
the PVT effect quantifier comprises a first counter configured to provide a first counter value during a time period, and
the PVT effect transducer comprises a first ring oscillator connected to the first counter and configured to generate pulses to be counted by the first counter as the first counter value during the time period.

18. The integrated circuit of claim 17, wherein
the PVT effect quantifier further comprises a second counter configured to provide a second counter value during the time period, and
the PVT effect transducer further comprises a second ring oscillator connected to the second counter and configured to generate pulses to be counted by the second counter as the second counter value during the time period.

19. The integrated circuit of claim 18, wherein
the PVT effect quantifier further comprises a counter comparator configured to compare the first counter value with the second counter value, and select the first counter value or the second counter value as the output of the PVT effect quantifier.

20. The integrated circuit of claim 16, wherein
the bias controller is further configured to compare the digital output received from the PVT effect quantifier to a second threshold value that is higher than the first threshold value, and decrease the bias voltage if the digital output is higher than the second threshold value.

* * * * *